(12) United States Patent
Eguchi

(10) Patent No.: US 9,606,928 B2
(45) Date of Patent: Mar. 28, 2017

(54) MEMORY SYSTEM

(71) Applicant: KABUSHIKI KAISHA TOSHIBA, Minato-ku, Tokyo (JP)

(72) Inventor: Yasuyuki Eguchi, Kawasaki Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 54 days.

(21) Appl. No.: 14/630,444

(22) Filed: Feb. 24, 2015

(65) Prior Publication Data

US 2016/0062896 A1    Mar. 3, 2016

Related U.S. Application Data

(60) Provisional application No. 62/041,846, filed on Aug. 26, 2014.

(51) Int. Cl.
  *G11C 29/00* (2006.01)
  *G06F 12/0868* (2016.01)
  *G06F 11/10* (2006.01)
  *G11C 29/52* (2006.01)
  *G11C 7/22* (2006.01)
  *G11C 8/12* (2006.01)
  *G11C 29/04* (2006.01)

(52) U.S. Cl.
  CPC ...... *G06F 12/0868* (2013.01); *G06F 11/1068* (2013.01); *G11C 7/22* (2013.01); *G11C 8/12* (2013.01); *G11C 29/52* (2013.01); *G11C 2029/0411* (2013.01)

(58) Field of Classification Search
  None
  See application file for complete search history.

(56) References Cited

U.S. PATENT DOCUMENTS

| 5,703,822 | A | 12/1997 | Ikeda | |
|---|---|---|---|---|
| 6,470,051 | B1 * | 10/2002 | Campisano | H04N 19/159 375/240.21 |
| 7,561,897 | B2 * | 7/2009 | Karr | G04G 21/04 370/204 |
| 2003/0233503 | A1 * | 12/2003 | Yang | G06F 13/1663 710/100 |
| 2005/0262323 | A1 | 11/2005 | Woo et al. | |
| 2009/0276570 | A1 * | 11/2009 | Cheng | G06F 11/3419 711/115 |
| 2010/0169549 | A1 * | 7/2010 | Yano | G06F 12/0862 711/103 |

(Continued)

FOREIGN PATENT DOCUMENTS

WO    2004025478 A1    3/2004

*Primary Examiner* — Daniel McMahon
(74) *Attorney, Agent, or Firm* — Holtz, Holtz & Volek PC

(57) ABSTRACT

A memory system includes: a memory controller which executes a data access process with an external device using an access unit; a first memory which is connected to the memory controller via a bus and has a first latency; and a second memory which is connected to the memory controller via a bus and has a second latency longer than the first latency. The access unit comprises a first access size assigned to the first memory and a second access size assigned to the second memory. The memory controller executes a data access process with the first memory using the first access size, and executes a data access process with the second memory using the second access size.

20 Claims, 14 Drawing Sheets

(56) References Cited

U.S. PATENT DOCUMENTS

| | | | |
|---|---|---|---|
| 2011/0131366 A1 | 6/2011 | Nakai et al. | |
| 2011/0141922 A1* | 6/2011 | Kotrla | H04L 12/2697 370/252 |
| 2012/0066432 A1* | 3/2012 | Miura | G06F 13/161 711/102 |
| 2013/0185527 A1* | 7/2013 | Puckett | G11C 8/12 711/154 |
| 2015/0163253 A1* | 6/2015 | Noldus | H04L 65/605 370/352 |
| 2015/0215226 A1* | 7/2015 | Peled | H04L 49/40 370/412 |
| 2015/0347048 A1* | 12/2015 | Pawlowski | H04L 47/12 711/103 |

* cited by examiner

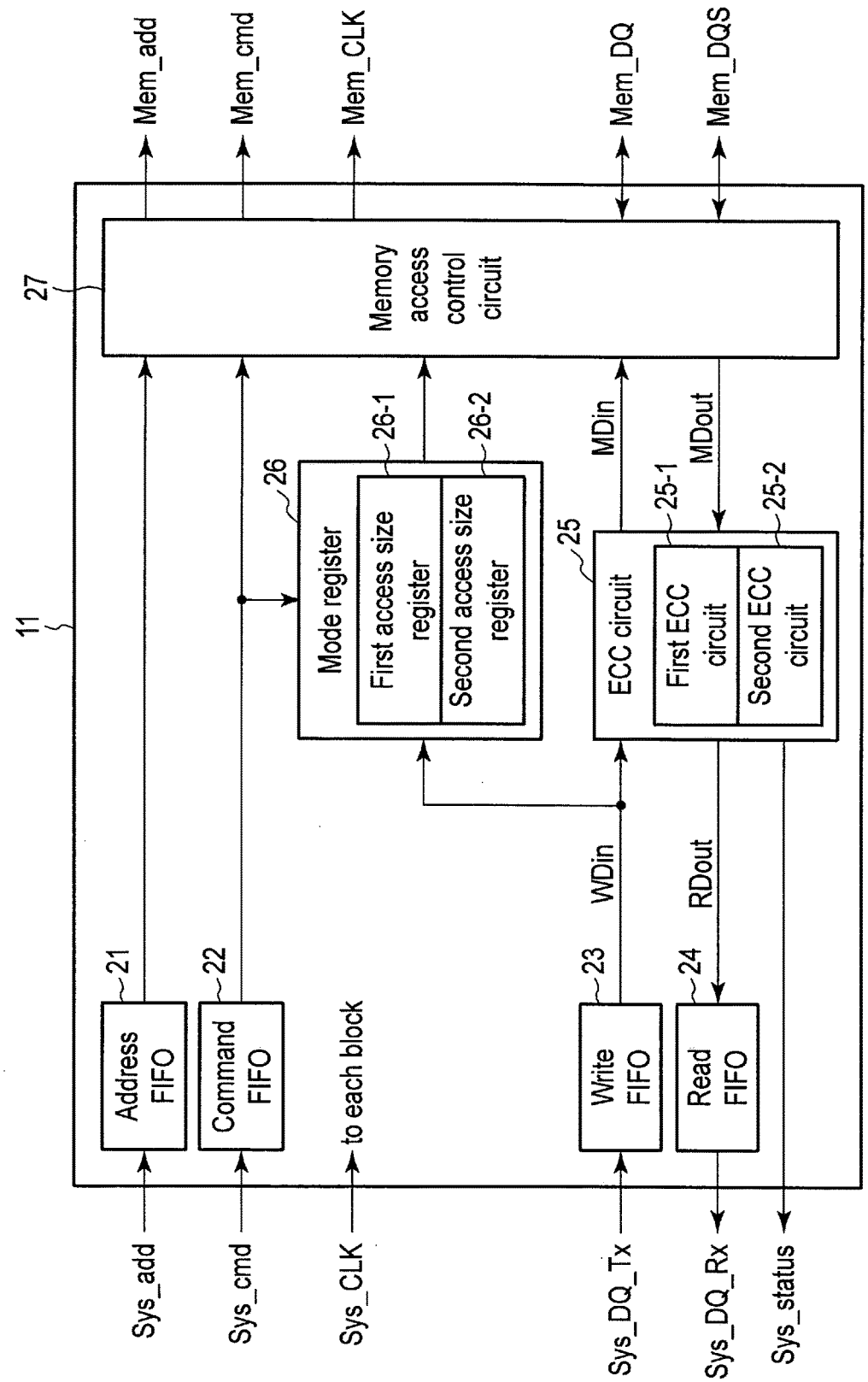
F I G. 3

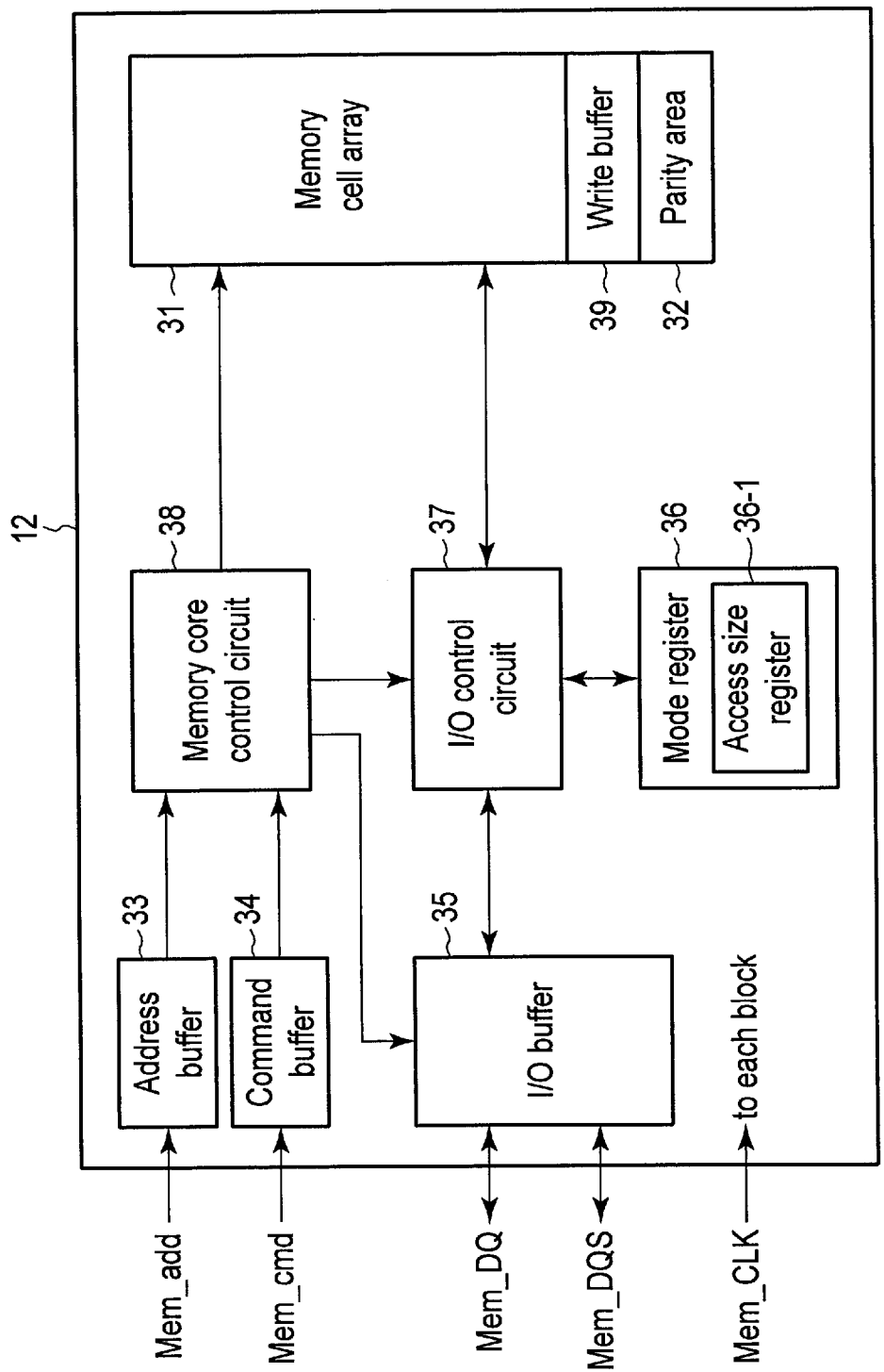
F I G. 4

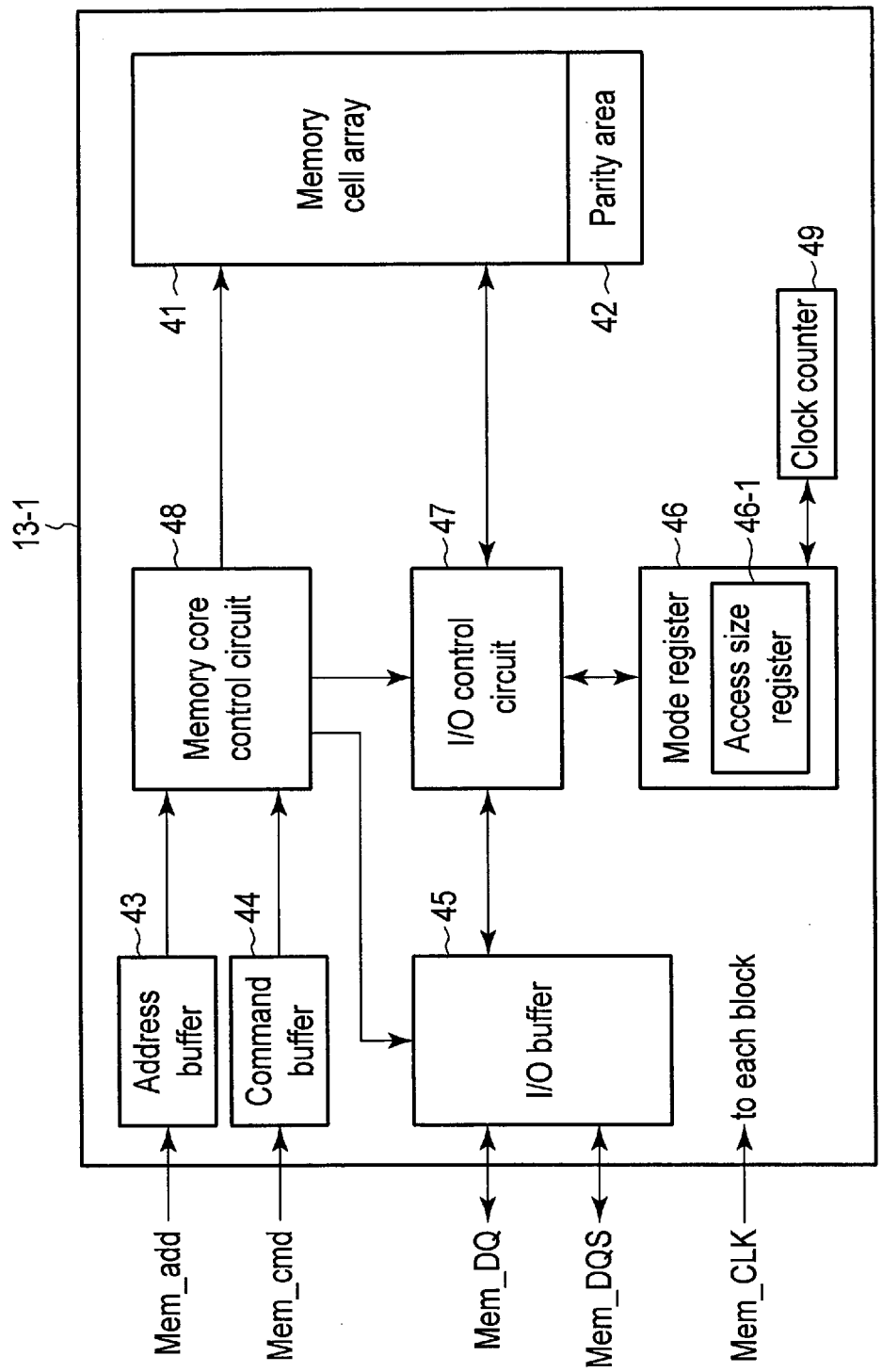
F I G. 5

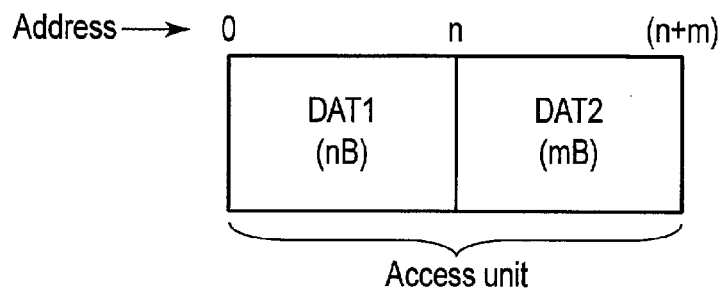
F I G. 6
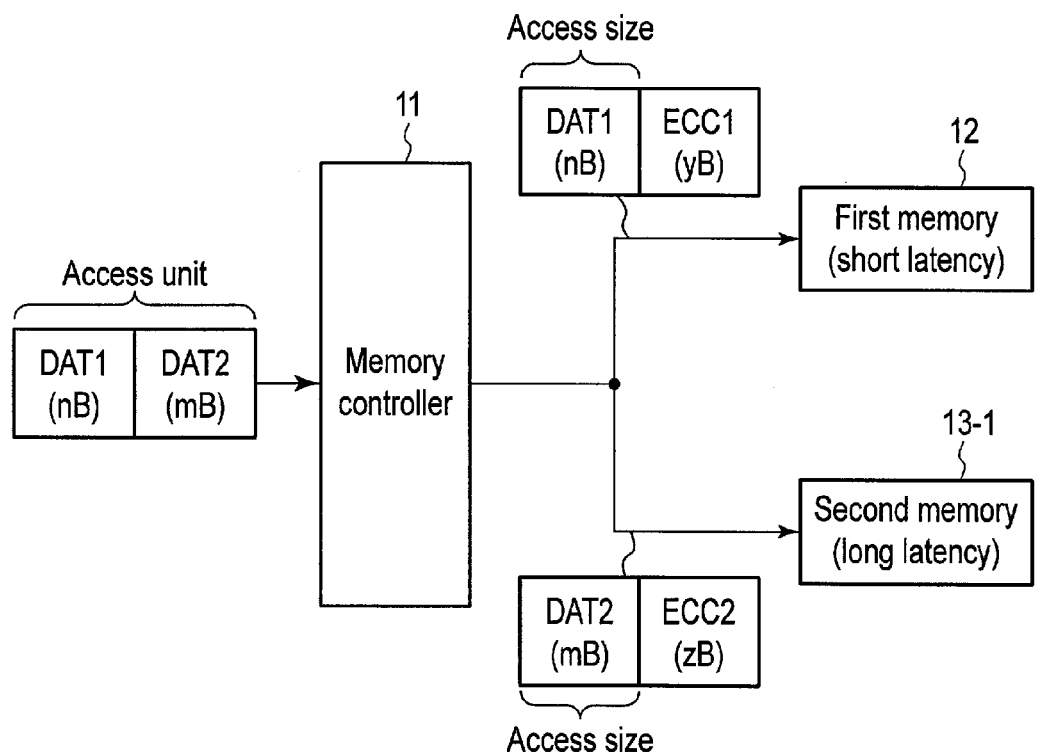
F I G. 7

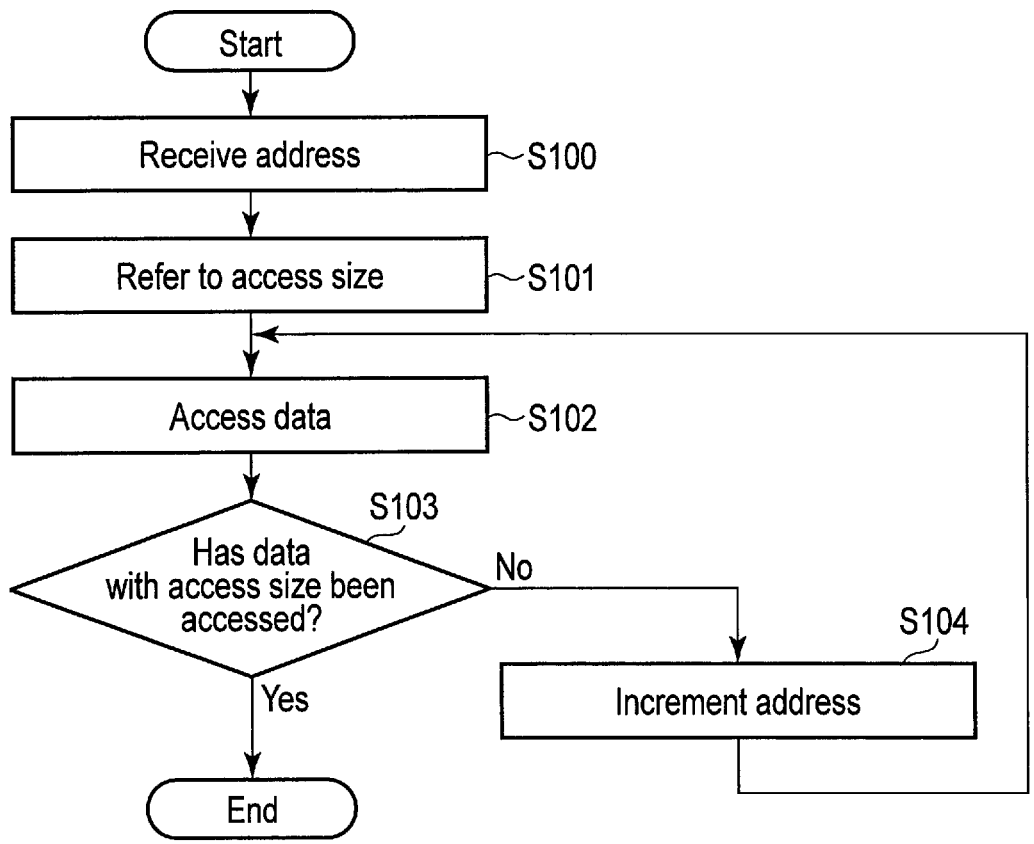
F I G. 9

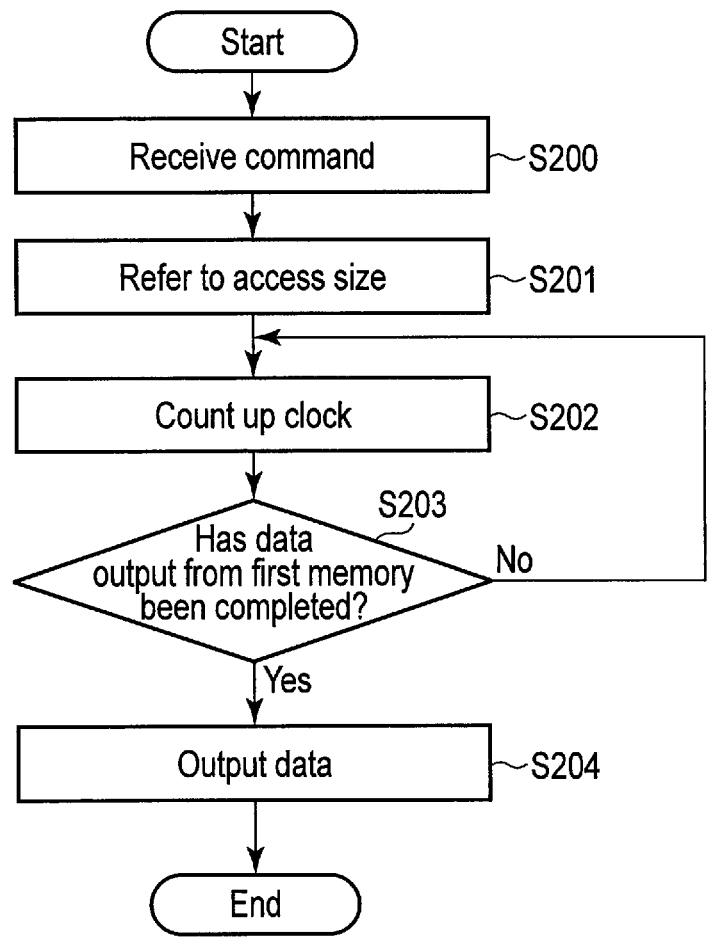
F I G. 10

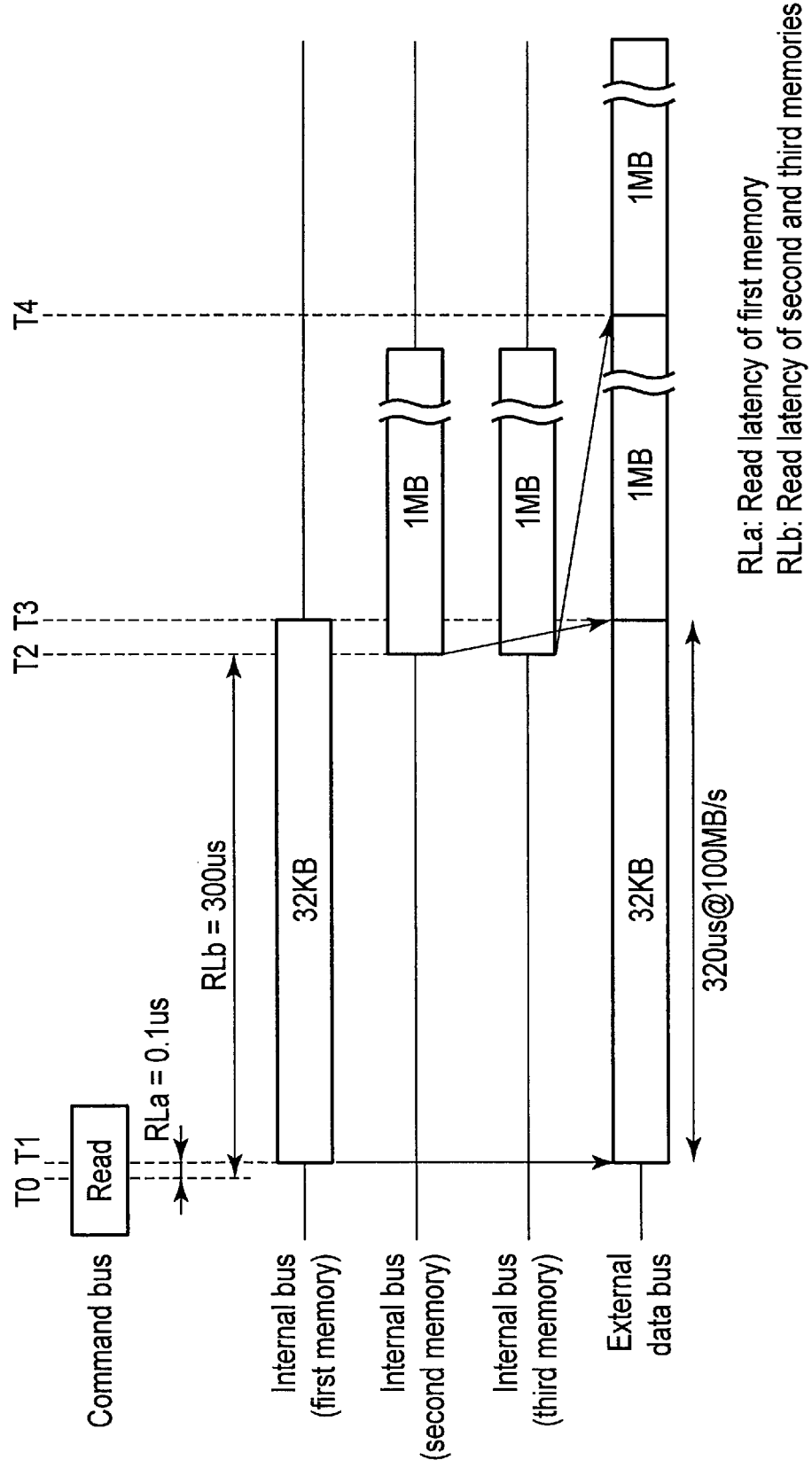
F I G. 11

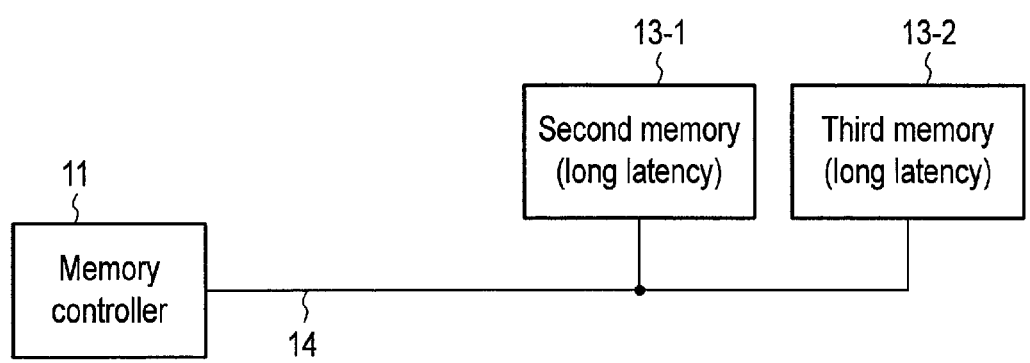
F I G. 12

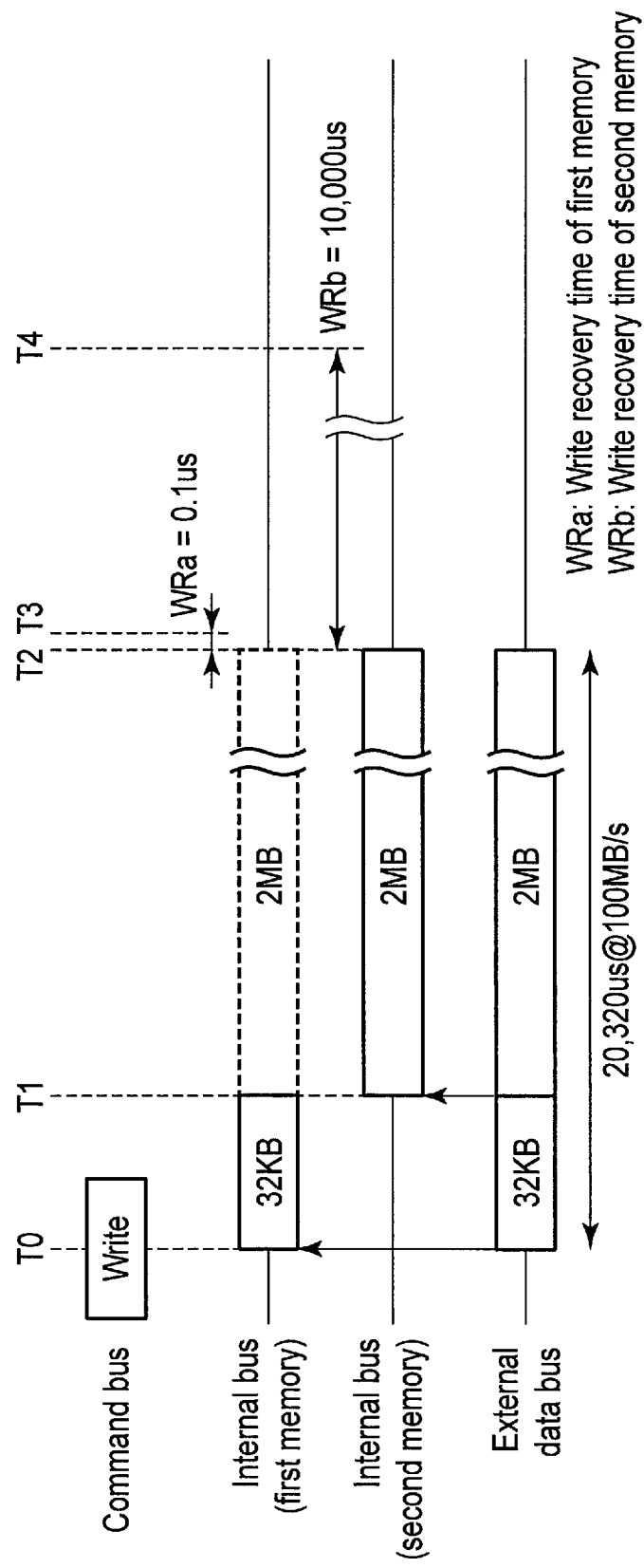
F I G. 14

MEMORY SYSTEM

CROSS-REFERENCE TO RELATED APPLICATIONS

This application claims the benefit of U.S. Provisional Application No. 62/041,846, filed Aug. 26, 2014, the entire contents of which are incorporated herein by reference.

FIELD

Embodiments described herein relate generally to a memory system.

BACKGROUND

A tendency involved in an increase in the amount of data is such that the time needed to search for data increases consistently with the amount of index of data, leading to an increased a size of a data file handled. Furthermore, there has been a demand to use larger amounts of data as an access unit in order to allow improvement of the efficiency of ECC used for hard disk drives (HDDs) or NAND flash memories.

In general, latency and the price of a memory are in a tradeoff relationship; a memory with a short latency is expensive, and an inexpensive memory has a long latency. Thus, implementing an inexpensive memory system with a short latency is difficult.

For example, memories with a short latency may be used as caches to improve the performance of the whole memory system and to minimize the use of expensive memories. However, disadvantageously, a cache miss may result in an increased latency and degraded performance, and repeating unexpected cache misses may be issued in latency sensitive applications. Furthermore, efficient use of a cache system needs the management comprising consideration of which address contents are placed in a memory with a short latency and which address contents are placed in a memory with a long latency. The cache management is performed by the policy, for example, least recently used (LRU) or using a flag whether the address has been accessed for a specified time. However, the management of the cache memory requires updating and searching for the order of addresses or the flag, which may degrade the performance.

BRIEF DESCRIPTION OF THE DRAWINGS

FIG. 3 is a block diagram of a memory controller according to the embodiment;

FIG. 4 is a block diagram of a first memory according to the embodiment;

FIG. 5 is a block diagram of a second memory according to the embodiment;

FIG. 6 is a schematic diagram illustrating an access unit managed by the memory controller;

FIG. 7 is a schematic diagram illustrating a data configuration involving an access unit for the memory controller and access sizes for the first memory and the second memory;

FIG. 9 is a flowchart illustrating an address control operation of the first memory;

FIG. 10 is a flowchart illustrating a data output operation of the second memory;

FIG. 11 is a timing chart of a reading operation according to another example;

FIG. 12 is a block diagram of a memory system according to a comparative example;

FIG. 14 is a timing chart of a writing operation according to the embodiment;

DETAILED DESCRIPTION

Figure 1:
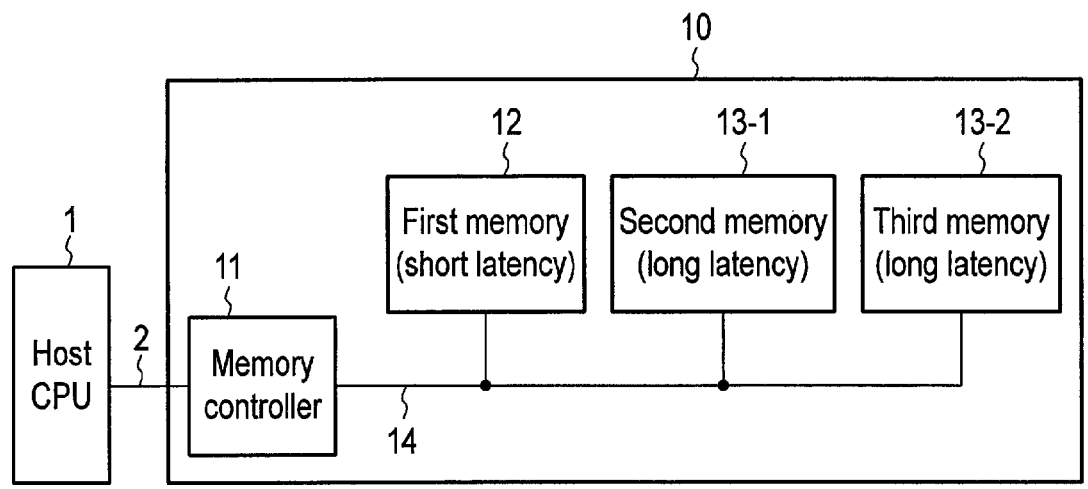
FIG. 1 is a block diagram of a memory system according to an embodiment.

In general, according to one embodiment, there is provided a memory comprising:

a memory controller which executes a data access process with an external host CPU using an access unit;

a first memory which is connected to the memory controller via a bus and has a first latency; and a second memory which is connected to the memory controller via a bus and has a second latency longer than the first latency;

wherein the access unit comprises a first access size assigned to the first memory and a second access size assigned to the second memory, and the memory controller executes a data access process with the first memory using the first access size, and executes a data access process with the second memory using the second access size.

The embodiment will be described below with reference to the drawings. In the description below, components with approximately the same functions and configurations are denoted by the same reference numerals, and duplicate descriptions are given only when needed. The embodiment illustrates an apparatus and a method both configured to embody the technical concepts of the embodiment. The technical concepts of the embodiment are not intended to limit the materials, shapes, structures, arrangements, and the like of the components to the following.

[Embodiment]

[1] Memory System Configuration

FIG. 1 is a block diagram of a memory system 10 according to the embodiment. The memory system 10 comprises a memory controller 11, a first memory 12, a second memory 13-1, a third memory 13-2, and an external data bus 14.

The memory controller 11 performs data access control with a host central processing unit (CPU) 1. The host CPU 1 is included in an electronic equipment, or an information processing apparatus. The memory controller 11 is connected to the host CPU 1 with a specific interface 2.

The memory controller 11 is connected to the first memory 12, the second memory 13-1, and the third memory 13-2 via a common external data bus 14. The memory controller 11 controls various operations for the first memory 12, the second memory 13-1, and the third memory 13-2. Additionally, the memory controller 11 performs data access control on the first memory 12, the second memory 13-1, and the third memory 13-2. The data access control includes a data writing operation, a data reading operation, and a data erasing operation.

The first memory 12 is a memory with a relatively short latency. The second memory 13-1 and the third memory 13-2 are each a memory with a relatively long latency. That is, the second memory 13-1 and the third memory 13-2 each have a longer latency than the first memory 12. In the embodiment, the second memory 13-1 and the third memory 13-2 each comprise the same type of memory, that is, the second memory 13-1 and the third memory 13-2 have the same latency. The first memory 12, the second memory 13-1, and the third memory 13-2 are each configured to be able to receive commands, addresses, and data sent from the memory controller 11 to perform a data access operation in accordance with these signals. The number of memories shown in FIG. 1 is an example; the number of memories with a relatively short latency, and the number of memories with a relatively long latency can be arbitrary. Moreover, the memory system 10 may be configured by combining three or more types of memories with difference latencies together.

The latency changes depending on a cycle (frequency) of clock for operations of a memory. For example, when a clock cycle of the first memory is different from a clock cycle of the second memory, the system of the embodiment can be applicable if there is a difference in the latency, which is defined as time, between the first memory and the second memory.

The first memory 12, the second memory 13-1, and the third memory 13-2 each comprise, for example, a nonvolatile semiconductor memory. An example of the first memory 12 with the short latency is a magnetic random access Memory (MRAM). An example of the second memory 13-1 and third memory 13-2 with the long latency is a NAND flash memory.

Figure 2:
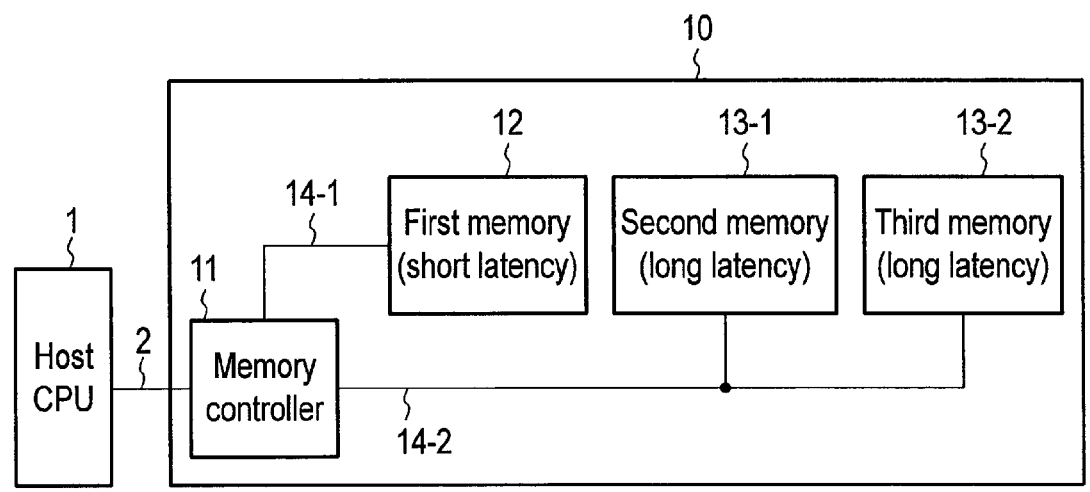
FIG. 2 is a block diagram of a memory system according to another example.

FIG. 2 is a block diagram of the memory system 10 according to another example. Two memory groups with different latencies may be connected together via separate external data buses. In the example in FIG. 2, the first memory 12 is connected to the memory controller 11 via an external data bus 14-1. The second memory 13-1 and the third memory 13-2 are connected to the memory controller 11 via an external data bus 14-2.

[1-1] Configuration of the Memory Controller 11

Now, an example of a configuration of the memory controller 11 will be described. FIG. 3 is a block diagram of the memory controller 11.

The memory controller 11 comprises an address buffer 21, a command buffer 22, a write buffer 23, a read buffer 24, an error checking and correcting (ECC) circuit 25, a mode register 26, and a memory access control circuit 27. The address buffer 21, the command buffer 22, the write buffer 23, and the read buffer 24 each comprise, for example, a first-in first-out (FIFO) buffer.

The address buffer 21 holds an address Sys_add input from the host CPU 1, and sends the address Sys_add to a memory access control circuit 27. The command buffer 22 holds a command Sys_cmd input from the host CPU 1, and sends the command Sys_cmd to the mode register 26 and the memory access control circuit 27.

The write buffer 23 holds input data SyS_DQ_Tx input from the host CPU 1, and sends the input data SyS_DQ_Tx as write data WDin to the ECC circuit 25 and the mode register 26. The read buffer 24 holds read data RDout sent from the ECC circuit 25, and sends the read data RDout as output data SyS_DQ_Rx to the host CPU 1.

The ECC circuit 25 comprises a first ECC circuit 25-1 for the first memory 12 and a second ECC circuit 25-2 for the second memory 13-1 and third memory 13-2. The first ECC circuit 25-1 and the second ECC circuit 25-2 each generate an error correcting code for write data WDin and generate write data MDin comprising write data WDin including an error correcting code. The write data MDin is sent to the memory access control circuit 27. Furthermore, the first ECC circuit 25-1 and the second ECC circuit 25-2 each perform error correction on the read data MDout sent from the memory access control circuit 27 using the error correcting code contained in the read data MDout.

The first ECC circuit 25-1 has an error correcting capability different from the second ECC circuit 25-2. In general, the number of bytes in the error correcting code increases consistently with level of the error correcting capability. For example, the first memory 12 has a smaller storage capacity than each of the second memory 13-1 and the third memory 13-2. In the case of this example, the second ECC circuit 25-2 is set to have a higher error correcting capability than the first ECC circuit 25-1.

The mode register 26 stores various parameters needed for operation of the memory controller 11. The mode register 26 comprises a first access size register 26-1 and a second access size register 26-2. The first access size register 26-1 stores access size information for the first memory 12. The second access size register 26-2 stores access size information for the second memory 13-1 and the third memory 13-2. Specifically, the first access size register 26-1 receives the access size information for the first memory 12 from the host CPU 1 via the write buffer 23, and stores the access size information. Similarly, the second access size register 26-2 receives the access size information for the second memory 13-1 and the third memory 13-2 from the host CPU 1 via the write buffer 23, and stores the access size information. The access size information stored in the first access size register 26-1 and the second access size register 26-2 can be externally rewritten. The mode register 26 may be configured using a nonvolatile memory.

The memory access control circuit 27 performs data access control on the first memory 12, the second memory 13-1, and the third memory 13-2. The memory access control circuit 27 sends an address Mem_add and a command Mem_cmd to the corresponding memory. Furthermore, the memory access control circuit 27 sends and receives data Mem_DQ and a strobe signal Mem_DQS to and from the corresponding memory. Moreover, the memory access control circuit 27 outputs status data Sys_status to the host CPU 1 via the ECC circuit 25.

The memory controller 11 receives a clock Sys_CLK from the host CPU 1. The clock Sys_CLK is sent to each block of the memory controller 11. The memory access control circuit 27 sends a clock Mem_CLK to the corresponding memory, based on the clock Sys_CLK.

[1-2] Configuration of the First Memory 12

Now, an example of a configuration of the first memory 12 will be described. FIG. 4 is a block diagram of the first memory 12. The first memory 12 comprises a memory cell array 31, a parity area 32, an address buffer 33, a command buffer 34, an input/output (I/O) buffer 35, a mode register 36, an I/O control circuit 37, a memory core control circuit 38, and a write buffer 39.

The memory cell array 31 comprises a plurality of nonvolatile memory cells. The write buffer 39 comprises a nonvolatile memory and stores particular write data sent from the I/O control circuit 37. The write buffer 39 may be assigned as a part of the memory cell array 31. Operations of the write buffer 39 will be described below.

The parity area 32 stores a parity code for write data and adds the parity code to the write data.

The address buffer 33 holds the address Mem_add input from the memory controller 11, and sends the address Mem_add to the memory core control circuit 38. The command buffer 34 holds the command Mem_cmd input from the memory controller 11, and sends the command Mem_cmd to the memory core control circuit 38. The I/O buffer 35 holds the data Mem_DQ and the strobe signal Mem_DQS.

The mode register 36 stores various parameters needed for operations of the first memory 12. The mode register 36 comprises an access size register 36-1. The access size register 36-1 stores access size information for the first memory 12. The access size information stored in the access size register 36-1 can be rewritten by the I/O control circuit 37. The mode register 36 may be configured using a non-volatile memory.

The I/O control circuit 37 sends and receives the data Mem_DQ and the strobe signal Mem_DQS to and from the memory controller 11. Furthermore, the I/O control circuit 37 sends write data to the memory cell array 31 and the write buffer 39 and receives read data from the memory cell array 31.

The memory core control circuit 38 controls whole operations of the first memory 12. Furthermore, the memory core control circuit 38 performs data access control based on the access size information stored in the access size register 36-1.

The first memory 12 receives the clock Mem_CLK from the memory controller 11. The clock Mem_CLK is sent to each block of the first memory 12.

Now, an example of a configuration of the second memory 13-1 and the third memory 13-2 will be described. FIG. 5 is a block diagram of the second memory 13-1. A block diagram of the third memory 13-2 is the same as FIG. 5.

The second memory 13-1 comprises a memory cell array 41, a parity area 42, an address buffer 43, a command buffer 44, an I/O buffer 45, a mode register 46, an I/O control circuit 47, a memory core control circuit 48, and a clock counter 49. The memory cell array 41 comprises a plurality of memory cells of a type different from the memory cell type in the first memory 12. The mode register 46 comprises an access size register 46-1 that stores access size information for the second memory 13-1. The clock counter 49 counts the clock Mem_CLK. The count result by the clock counter 49 is used for a timing control a timing control described later (for example, a paragraph "[3-1-2] Data Output Operation"). Basic operations of other circuits are the same as the basic operations of the circuits in FIG. 4.

[2] Access Unit

Now, the access unit managed and used by the memory controller 11 will be described. FIG. 6 is a schematic diagram illustrating the access unit managed by the memory controller 11. By way of example, the second memory 13-1 will be described as an example of the memory with the long latency. However, the third memory 13-2 can perform operations similar to the corresponding operations of the second memory 13-1.

The memory controller 11 receives data with the access unit shown in FIG. 6 from the host CPU 1. The access unit is a data size equal to the sum of data DAT1 and data DAT2. The access unit is a data size predefined between the memory controller 11 and the host CPU 1. The memory controller 11 and the host CPU 1 perform data accesses to each other using the access unit. An example of the access unit is a sector or a page.

According to the embodiment, the access unit predetermined by the memory controller and the host CPU is (n+m) bytes. The first memory 12 with the short latency is assigned with data DAT1 of n bytes (B) starting at the address of the access unit. The second memory 13-1 with the long latency is assigned with data DAT2 of m bytes following the data DAT1. That is, addresses 0 to (n-1) are assigned to the first memory 12 with the short latency. Addresses n to (n+m−1) are assigned to the second memory 13-1 with the long latency. Furthermore, an error correcting code might be added to the data of (n+m) bytes by an external circuit such as the host CPU to which the memory controller 11 is connected, and is not used in the memory system 10.

For example, n bytes, corresponding to the size of the data DAT1, are set so as to establish the following relation, with the latency and data rate (data transfer rate) of the second memory 13-1 taken into account.

$$n \text{ bytes} > (\text{latency of the second memory}) \times (\text{data rate of the second memory}) \times (\text{I/O width})$$

By way of example, when the latency of the second memory 13-1=300 µs, the data rate of the second memory 13-1=100 Mbps, and the I/O width of the second memory 13-1=8 bits, an access size (n bytes) for the first memory 12 is set to be larger than 30 Kbytes as expressed by:

$$n \text{ bytes} > 300 \text{ µs} \times 100 \text{ Mbps} \times 8 = 30 \text{ Kbytes}$$

When an access size (m bytes) for the second memory 13-1 is assumed to be, for example, 64 times as large as the access size for the first memory 12, m=2M bytes.

Furthermore, the performance of the memory system 10 can be improved by increasing the rate of the access size for the first memory 12. On the other hand, the price of the memory system 10 can be reduced by increasing the rate of the access size for the second memory 13-1.

Furthermore, management information for the access unit such as a keyword, a tag, an ID (identifier), and the location and size of data (the management information include attribute information and metadata) may be stored in the data DAT1, with the data body stored in the data DAT2. In such case, data can be searched for and moved simply by performing a reading/writing operation on the data DAT1, enabling higher speed operations.

FIG. 7 is a schematic diagram illustrating a data configuration involving the access unit for the memory controller 11 and the access sizes for the first memory 12 and the second memory 13-1.

The memory controller 11 receives the access unit corresponding to the combination of the data DAT1 (n bytes) and the data DAT2 (m bytes) from the host CPU 1. For example, the memory controller 11 divides the access unit into the data DAT1 and the data DAT2 for management. The memory controller 11 adds an error correcting code ECC1 of y bytes to the data DAT1, while adding an error correcting code ECC2 of z bytes to the data DAT2. Furthermore, the ECC scheme and the size of the error correcting code may be varied between the first memory 12 and the second memory 13-1 so that, for the first memory 12, an error correcting code ECC1 of 8 bytes is generated for the data DAT1=64 bytes, whereas for the second memory 13-1, an error correcting code ECC2 of 40 bytes is generated for the data DAT2=1 Kbytes. As shown in FIG. 3, the ECC scheme is controlled by the first ECC circuit 25-1 for the first memory 12 and the second ECC circuit 25-2 for the second memory 13-1 and the third memory 13-2.

[3] Operations

Now, operations of the memory system 10 configured as described above will be described below.

[3-1] Reading Operation

Figure 8:
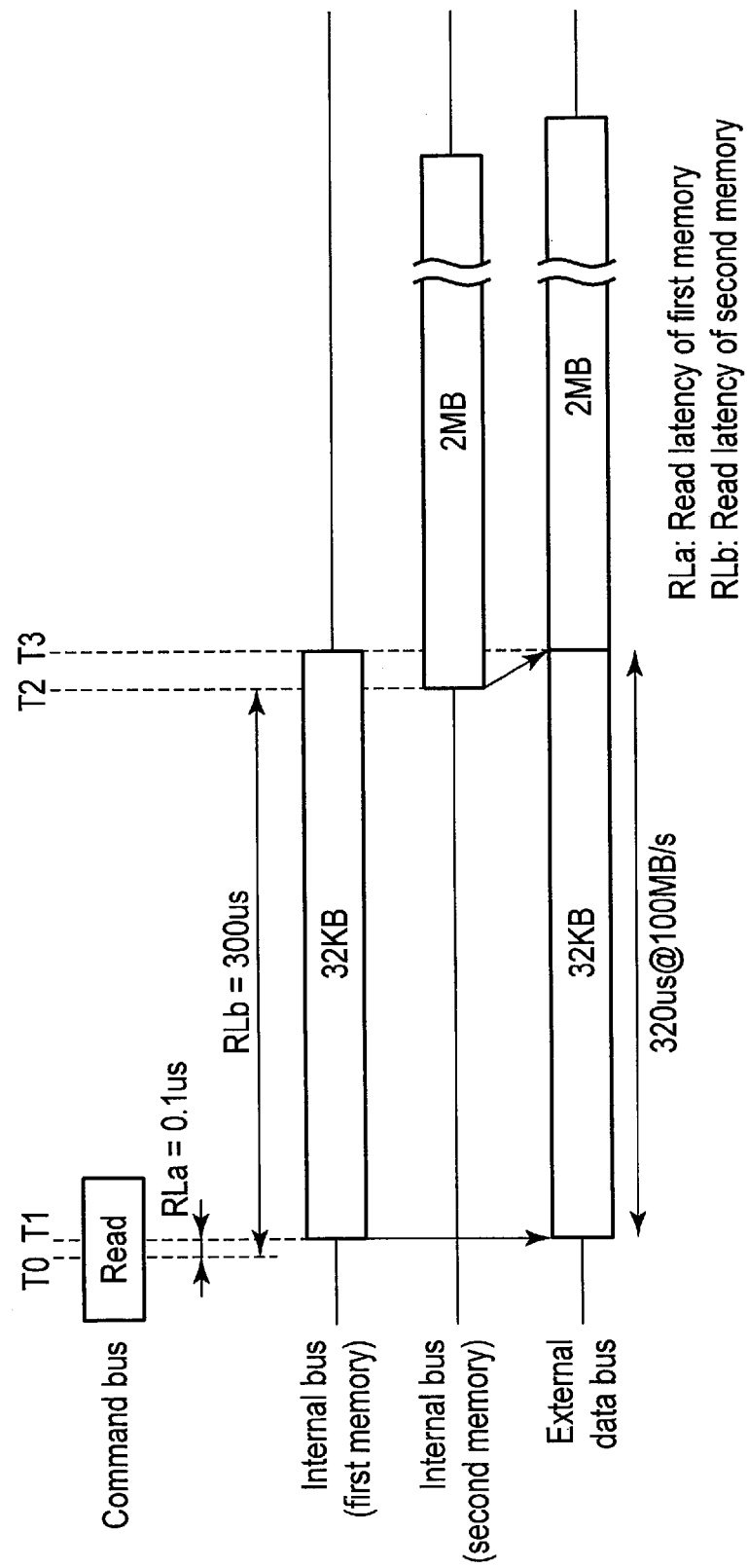
FIG. 8 is a timing chart of a reading operation according to the embodiment.

First, the reading operation of the memory system 10 will be described. FIG. 8 is a timing chart of the reading operation according to the embodiment. FIG. 8 illustrates the reading operation for a configuration (corresponding to FIG. 1) in which the common external data bus 14 is connected to the first memory 12, the second memory 13-1, and the third memory 13-2. Internal buses shown in FIG. 8 are data buses in the first memory 12 and the second memory 13-1.

First, at a point in time T0, the memory controller 11 issues a read command simultaneously to the first memory 12 and the second memory 13-1 via a command bus. Furthermore, along with the read command, the memory controller 11 sends an address (not shown in the drawings) to the first memory 12 and the second memory 13-1. In response to the read command, the first memory 12 and the second memory 13-1 each execute a reading process of reading data from the memory cell array.

Subsequently, at a point in time T1, the first memory 12 outputs read data with the access size including parity (for example, 32 Kbytes) for the first memory 12 to the external data bus 14. The period between T0 and T1 is a read latency RLa of the first memory 12, and for example, RLa=0.1 μs. The read latency is a wait time from reception of the read command until the data is read from the memory cell array. For example, when the data rate of the first memory 12 is assumed to be 100 MB/s (=100 Mbps×8 bits I/O), the time needed to output read data including parity of 32 Kbytes to the external data bus is about 320 μs.

Subsequently, at a point in time T2, the second memory 13-1 is ready to output the read data to the external data bus 14. However, since the read data from the first memory 12 has been output onto the external data bus 14, the second memory 13-1 waits to output the data. Alternatively, the memory controller 11 may, for example, use an appropriate command to control the timing of the output data from the second memory 13-1. The period between T0 and T2 is a read latency RLb of the second memory 13-1, and for example, RLb=300 μs.

Subsequently, at a point in time T3, the output of the read data from the first memory 12 is complete. Thus, the second memory 13-1 outputs read data of the access size (for example, 2 Mbytes) for the second memory 13-1 to the external data bus 14. Thereafter, the memory controller 11 receives the read data from the first memory 12 and the second memory 13-1 via the external data bus 14. That is, the memory controller 11 receives the access unit (including parity) "32 Kbytes+2 Mbytes" from the first memory 12 and the second memory 13-1.

In a configuration (corresponding to FIG. 2) in which the external data bus is separated into a portion for the first memory 12 and a portion for the second memory 13-1, the reading operation of the first memory 12 and the reading operation of the second memory 13-1 may be performed in parallel.

[3-1-1] Address Control Operation

Now, address control operations of the first memory 12, the second memory 13-1, and the third memory 13-2 will be described. The address control operations may be specified such that, during access to the memory cell array, the address is automatically incremented by the access size set in the access size register. FIG. 9 is a flowchart illustrating the address control operation of the first memory 12. The operation in FIG. 9 is also applicable to the second memory 13-1 and the third memory 13-2.

The memory core control circuit 38 receives the address from the memory controller 11 (step S100). Subsequently, the memory core control circuit 38 refers to the access size stored in the access size register 36-1 (step S101).

Subsequently, the memory core control circuit 38 uses the address to access the memory cell array 31, that is, to read data from the memory cell array 31 (step S102). Then, the memory core control circuit 38 determines whether or not data with the access size stored in the access size register 36-1 has been accessed (step S103).

In step S103, when data of the access size has not been accessed, the memory core control circuit 38 increments the address (step S104). Then, the memory core control circuit 38 repeats incrementing the address until data of the access size is accessed.

For example, when the first memory 12 has an access unit (page size) of 256 bytes (a column address is 8 bits) and the access size (including parity) is 32,768 bytes, the first memory 12 accesses an area of 32,768 bytes by accessing a page of 256 bytes 128 times. That is, the memory core control circuit 38 performs control so as to automatically access the memory cell array in the first memory 12 128 times using only the information on the address received from the memory controller 11. Therefore, this enables the address control of the memory controller 11 to be simplified. The page size of the first memory 12 is an access unit used to write data to the memory cell array 31 in the first memory 12 and to read data from the memory cell array 31.

Furthermore, the first memory 12 may have special function to access an area of 32,768 bytes through a single command using internal bank interleaving.

[3-1-2] Data Output Operation

For the data output from the second memory 13-1, the output timing may be adjusted by storing the access size for the first memory 12 and counting a clock in accordance with the access size. FIG. 10 is a flowchart illustrating the data output operation of the second memory 13-1. The operation in FIG. 10 is also applicable to the third memory 13-2. The access size register 46-1 shown in FIG. 5 stores the access size information for the first memory 12 in addition to the access size information for the second memory 13-1.

The memory core control circuit 48 receives a read command from the memory controller 11 (step S200). Subsequently, the memory core control circuit 48 refers to the access size (n bytes) for the first memory 12 stored in the access size register 46-1 (step S201). Then, the memory core control circuit 48 counts up the clock (step S202). The clock is supplied, for example, by the memory controller 11.

Subsequently, the memory core control circuit 48 determines whether or not the first memory 12 has completed the operation of outputting the data to the external data bus 14, based on the count result for the clock (step S203). Specifically, the memory core control circuit 48 uses the access size in step S201 to calculate the number of clock cycles needed for the first memory 12 to output the data. The memory core control circuit 48 compares the calculation result with the count result for the clock to determine that the data output from the first memory 12 is complete. At the timing when the data output from the first memory 12 is complete, the memory core control circuit 48 outputs the data read from the memory cell array 41 to the external data bus 14 (step S204).

The data output from the second memory 13-1 is not limited to the above-described embodiment, and the output timing may be controlled by the memory controller 11 by using an appropriate command.

[3-1-3] Another Example of the Reading Operation

Now, another example of the reading operation will be described. FIG. 11 is a timing chart of a reading operation according to another example. FIG. 11 illustrates operations in which data is read from the first memory 12, the second memory 13-1, and the third memory 13-2.

First, at the point in time T0, the memory controller 11 issues a read command simultaneously to the first memory 12, the second memory 13-1, and the third memory 13-2 via the command bus. In response to the read command, the first memory 12, the second memory 13-1, and the third memory 13-2 each execute a reading process of reading data from the memory cell array.

Subsequently, at the point in time T1, the first memory 12 outputs read data with the access size including parity(for example, 32 Kbytes) for the first memory 12 to the external data bus 14. Then, at the point in time T3, the second memory 13-1 outputs read data with a part (for example, 1 Mbytes) of the access size including parity (for example, 2 Mbytes) for the memory with the long latency, to the external data bus 14.

Subsequently, at a point in time T4, after the output of the read data from the second memory 13-1 is complete, the third memory 13-2 outputs read data with the remaining part (for example, 1 Mbytes) of the access size including parity for the memory with the long latency, to the external data bus 14. As in the example shown in FIG. 11, data with the access size including parity (m bytes) to be read from the memory with the long latency may be read partly from the second memory 13-i and partly from the third memory 13-2. For the data output from the third memory 13-2, the output timing may be adjusted by counting the clock in accordance with the access size including parity of "32 Kbytes+1 Mbytes". Alternatively, the memory controller 11 may adjust the output timing using an appropriate command.

[3-1-4] Comparative Example

Now, a reading operation according to a comparative example will be described. FIG. 12 is a block diagram of a memory system according to the comparative example. The memory system comprises the second memory 13-1 and the third memory 13-2 both with a long latency, and the second memory 13-1 and the third memory 13-2 are connected to the memory controller 11 via the external data bus 14. That is, the memory system according to the comparative example does not comprise the first memory 12 with a short latency.

Figure 13:
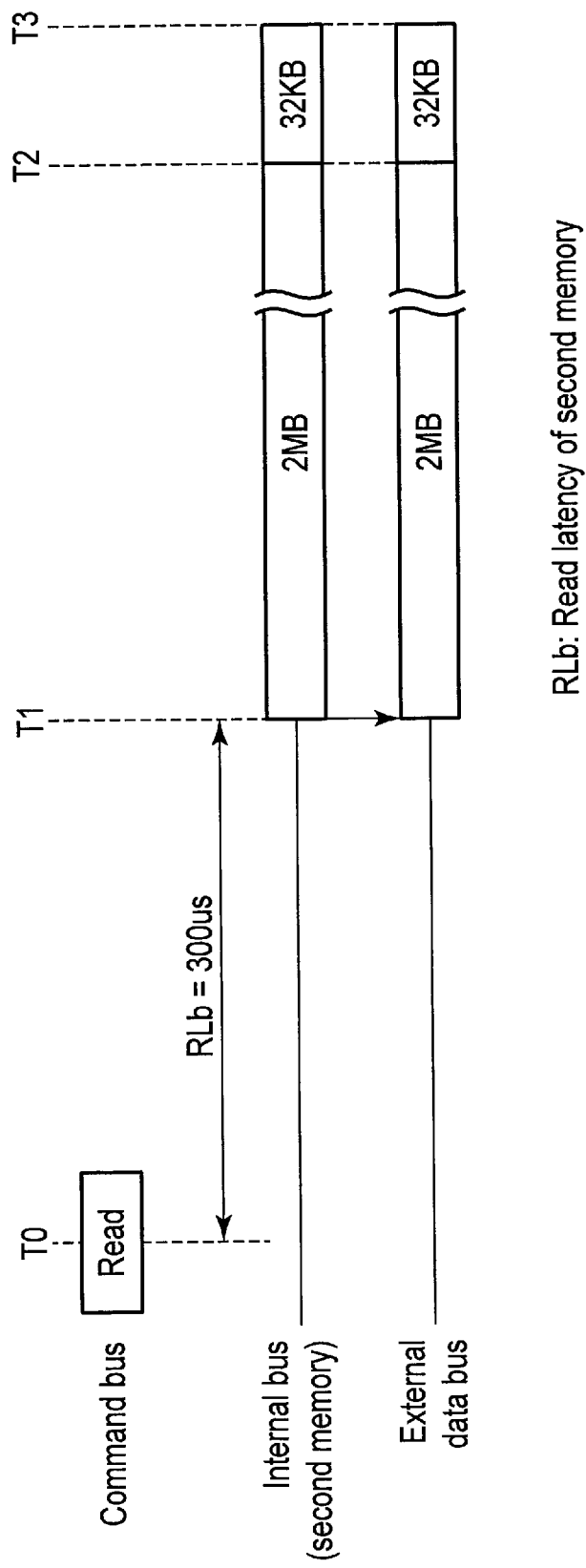
FIG. 13 is a timing chart of a reading operation according to the comparative example.

FIG. 13 is a timing chart of the reading operation according to the comparative example. FIG. 13 illustrates a reading operation of the second memory 13-1 by way of example.

First, at the point in time T0, the memory controller 11 issues a read command to the second memory 13-1 via the command bus. In response to the read command, the second memory 13-1 executes a process of reading data from the memory cell array.

Subsequently, at the point in time T1, the second memory 13-1 outputs read data including parity with 2 Mbytes to the external data bus 14. Then, at the point in time T2, the second memory 13-1 outputs read data including parity with n=32 Kbytes to the external data bus 14. Thereafter, at the point in time T3, the reading operation of the second memory 13-1 is completed, and finally, the read data including parity of "2 Mbytes+32 Kbytes" is output from the second memory 13-1 to the memory controller 11 as is the case with the above-described embodiment.

In the comparative example in FIG. 13, no data output is performed during the read latency RLb, thus increasing the amount of time until the reading operation is completed. In contrast, in the embodiment in FIG. 8, the data including parity of 32 Kbytes is output from the first memory 12 with the short latency during the read latency RLb. Thus, the embodiment enables a reduction in the time needed to complete the reading operation compared to the comparative example.

[3-2] Writing Operation

Now, a writing operation of the memory system 10 will be described. FIG. 14 is a timing chart of the writing operation according to the embodiment. FIG. 14 illustrates the writing operation for the configuration (corresponding to FIG. 1) in which the common external data bus 14 is connected to the first memory 12, the second memory 13-1, and the third memory 13-2. Internal buses shown in FIG. 14 are the data buses in the first memory 12 and the second memory 13-1.

First, at the point in time T0, the memory controller 11 issues a write command simultaneously to the first memory 12 and the second memory 13-1 via the command bus. Furthermore, along with the write command, the memory controller 11 sends an address (not shown in the drawings) to the first memory 12 and the second memory 13-1. For the address control operations of the first memory 12 and the second memory 13-1, FIG. 9 described above for the reading operation is applicable.

Moreover, at the point in time T0, the memory controller 11 outputs write data with the access size including parity (for example, 32 Kbytes) for the first memory 12 to the external data bus 14. In response, the first memory 12 receives the write data. Specifically, the write data is held in the I/O buffer 35 of the first memory 12. The memory controller 11 makes the second memory 13-1 wait to receive the data until the write data including parity of 32 Kbytes is output to the external data bus 14.

Subsequently, at the point in time T1, the transfer of the write data including parity of 32 Kbytes to the first memory 12 is completed. Furthermore, at the point in time T1, the memory controller 11 outputs write data with the access size including parity (for example, 2 Mbytes) for the second memory 13-1 to the external data bus 14. In response, the second memory 13-1 receives the write data. Specifically, the write data is held in the I/O buffer 45 of the second memory 13-1. Furthermore, at the point in time T1, the first memory 12 receives and writes the write data including parity for the second memory 13-1 (2 Mbytes) to the write buffer 39. The write buffer 39 has a storage capacity set equal to the access size including parity (2 Mbytes) for the second memory 13-1 (or the third memory 13-2) with the long latency. The write buffer 39 is a nonvolatile storage area, and a part of the memory cell array 31 in the first memory may be used as a write buffer.

For the data receiving of the second memory 13-1, the receiving timing of the write data may be adjusted by the memory core control circuit 48 using the access size for the first memory 12 in the mode register of the second memory 13-1 and counting the clock in accordance with the access size. FIG. 10 described above for the reading operation is applicable to the data receiving operation using the clock. Alternatively, the memory controller 11 may control the receiving timing using an appropriate command.

Subsequently, at the point in time T2, the transfer of the write data including parity of 2 Mbytes to the second memory 13-1 is completed. Moreover, in parallel with the operation of transfer to the second memory 13-1 as a background process, the operation of writing the write data including parity of 2 Mbytes to the write buffer 39 of the first memory 12 is completed. For example, when the data rate of the first memory 12 is 100 MB/s (=100 Mbps×8 bits I/O), the time needed to transfer the write data including parity of "2 Mbytes+32 Kbytes" from the external data bus to the first memory 12 is about 20,320 µs.

Subsequently, the first memory 12 and the second memory 13-1 each write the received write data to the memory cell array. For example, the first memory 12 has a write recovery time WRa of about 0.1 and the second memory 13-1 has a write recovery time WRb of about 10,000 µs. The write recovery time is the amount of time until writing is completed inside a chip (until the data is written to the memory cell array).

Subsequently, at the point in time T3, the writing operation of the first memory 12 is completed. Then, at the point in time T4, the writing operation of the second memory 13-1 is completed.

The second memory 13-1 has a write time (write recovery time) that is 100,000 times as long as the write time of the first memory 12. If sudden power loss (power shutdown) occurs during a period T3 to T4 when the writing operation of the second memory 13-1 is not complete, write data in process may be corrupted. However, in the embodiment, the write data for the second memory 13-1 is also stored in the write buffer 39 of the first memory 12. Hence, after a power supply is turned on again, the write data for the second memory 13-1 can be restored by copying from the write buffer 39 of the first memory 12. Specifically, after the power supply is turned on again, the memory controller 11 uses an appropriate command to transfer the write data including parity of 2 Mbytes stored in the write buffer 39 of the first memory 12 to the second memory 13-1. The second memory 13-1 writes the write data transferred from the first memory 12 to the memory cell array.

Furthermore, since the write data for the second memory 13-1 is stored in the write buffer 39 of the first memory 12 at the point in time T3, the memory system may have a specification to commit that the writing operation is completed at the point in time T3. This specification enables a substantial reduction in the write time in the specifications.

In the configuration (corresponding to FIG. 2) in which the external data bus is separated into a portion for the first memory 12 and a portion for the second memory 13-1, the write data including parity of "2 Mbytes+32 Kbytes", which corresponds to the access unit for the memory controller 11, may be transferred to the first memory 12 in parallel with the transfer of the write data to the second memory 13-1.

[3-2-1] Another Example of the Writing Operation

Figure 15:
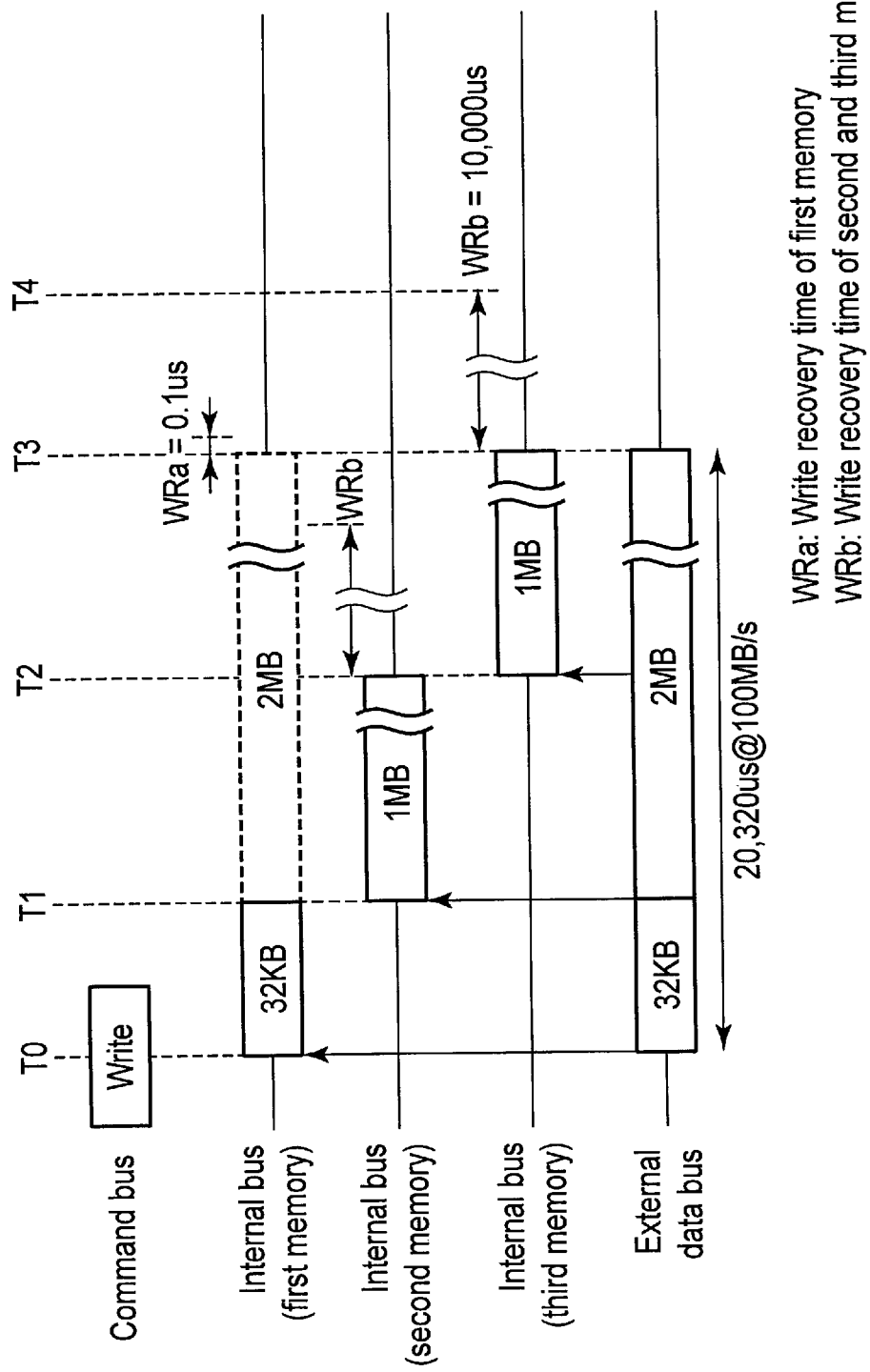
FIG. 15 is a timing chart of a writing operation according to another example.

Now, another example of the writing operation will be described. FIG. 15 is a timing chart of the writing operation according to this example. FIG. 15 illustrates an operation of writing data to the first memory 12, the second memory 13-1, and the third memory 13-2.

First, at the point in time T0, the memory controller 11 issues a write command simultaneously to the first memory 12, the second memory 13-1, and the third memory 13-2 via the command bus. Furthermore, at the point in time T0, the memory controller 11 outputs write data with the access size including parity (for example, 32 Kbytes) for the first memory 12 to the external data bus 14. In response, the first memory 12 receives the write data.

Subsequently, at the point in time T1, the memory controller 11 outputs write data with the access size including parity (for example, 2 Mbytes) for the memory with the long latency to the external data bus 14. In response, the second memory 13-1 receives a part of the access size including parity (for example, 1 Mbytes). Furthermore, at the point in time T1, the first memory 12 receives the write data including parity (2 Mbytes) for the second memory 13-1 and the third memory 13-2, and writes the 2Mbytes data including parity to the write buffer 39.

Subsequently, at the point in time T2, the third memory 13-2 receives the remaining part of the access size including parity (for example, 1 Mbytes). Then, at the point in time T3, the operation of data transfer to the third memory 13-2 is completed. Then, at the point in time T4, the operation of writing to the third memory 13-2 is completed. As in the example shown in FIG. 15, data with the access size (m bytes) to be written to the memory with the long latency may be written partly to the second memory 13-1 and partly to the third memory 13-2. For data receiving of the third memory 13-2, the receiving timing may be adjusted by counting the clock in accordance with an access size including parity of "32 Kbytes+1 Mbytes". Furthermore, the memory controller 11 may use an appropriate command to control the receiving timing.

[3-2-2] Comparative Example

Figure 16:
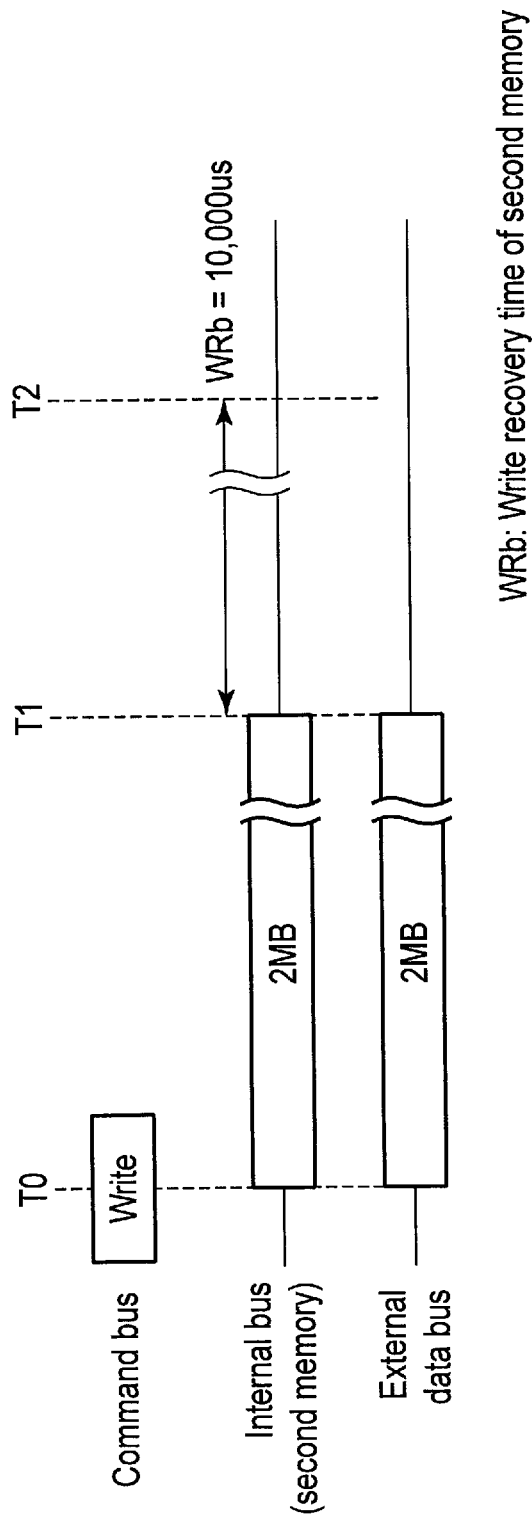
FIG. 16 is a timing chart of a writing operation according to a comparative example.

Now, a writing operation according to a comparative example will be described. A block diagram of a memory system according to the comparative example is the same as FIG. 12. FIG. 16 is a timing chart of the writing operation according to the comparative example. FIG. 16 illustrates a writing operation of the second memory 13-1 by way of example.

First, at the point in time T0, the memory controller 11 issues a write command to the second memory 13-1 via the command bus. Furthermore, the memory controller 11 outputs write data with the access size including parity (for example, 2 Mbytes) for the second memory 13-1 to the external data bus 14. In response, the second memory 13-1 receives the write data.

Subsequently, at the point in time T1, the operation of data transfer to the second memory 13-1 is completed. Then, at the point in time T2, the operation of writing to the second memory 13-1 is completed. In the comparative example, the writing operation is completed 10,000 µs after the point in time T1. Thus, if sudden power loss occurs during the period between T1 and T2, no write data is written to the second memory 13-1.

[4] Effects

As described above in detail, in the embodiment, the memory system 10 provides a storage area by combining the expensive first memory 12 with the relatively short latency and the inexpensive second memory 13-1 (and the third memory 13-2) with the relatively long latency. Then, the access unit used between the memory controller 11 and the host CPU 1 is divided into the first access size including parity (32 Kbytes) and the second access size including parity (2 Mbytes). The first access size is assigned to the first memory 12, and the second access size is assigned to the second memory 13-1.

Thus, the embodiment can implement an inexpensive memory system 10 with a short latency (including a read latency and a write recovery time). Furthermore, in contrast to a cache memory system, the memory system 10 makes the read latency and the write recovery time constantly short and predictable as long as the access starts at the head of a page or a sector, and eliminates the need for flag management of the cache memory and the like.

Additionally, in the reading operation, the data corresponding to a part of the access unit for the memory controller 11 is output from the first memory 12 with the short latency. This enables a reduction in the time needed to complete the data output especially when small part of data such as metadata is accessed.

In addition, in the writing operation, the first memory 12 and the second memory 13-1 perform the write recovery in parallel, enabling a reduction in the time needed to write data of the access unit. Furthermore, the first memory 12 with the short latency comprises the nonvolatile write buffer 39, which stores write data for the second memory 13-1 with the long latency. Thus, when sudden power loss occurs, the write data for the second memory 13-1 can be restored. Additionally, when the memory system 10 is specified to complete the write operation when writing to the write buffer 39 is completed, the write time of the memory system 10 can be significantly shortened.

The memory controller 11, the first memory 12, and the second memory 13 included in the memory system 10 may be provided in a package. The first memory 12 and the second memory 13 may be provided in a package, and the memory controller 11 may be provided in another package. The memory controller 11, the first memory 12, and the second memory 13 may be different packages. Same management of the access size unit may be done at the memory controller or the host CPU.

While certain embodiments have been described, these embodiments have been presented by way of example only, and are not intended to limit the scope of the inventions. Indeed, the novel embodiments described herein may be embodied in a variety of other forms; furthermore various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a memory controller which executes a data access process with an external device using an access unit;
a first memory which is connected to the memory controller via a first bus and which has a first latency; and
a second memory which is connected to the memory controller via a second bus and which has a second latency longer than the first latency;
wherein the access unit comprises a first access size assigned to the first memory and a second access size assigned to the second memory, and
the memory controller executes a first data access process with the first memory using the first access size, and executes a second data access process with the second memory using the second access size.

2. The system of claim 1, wherein the second access size is larger than the first access size.

3. The system of claim 1, wherein the first access size is set based on the second latency.

4. The system of claim 1, wherein the first access size is set such that the first memory completes the first data access process in the second latency.

5. The system of claim 1, wherein the memory controller includes a register which stores information of the first access size and information of the second access size.

6. The system of claim 1, wherein
the first memory includes a first register which stores information of the first access size, and
the second memory includes a second register which stores information of the second access size.

7. The system of claim 6, wherein
the second register further stores information of the first access size, and
the second memory includes a control circuit which controls a timing when data is received from the second bus and a timing when data is output to the second bus, using the information of the first access size and the first latency.

8. The system of claim 7, wherein the control circuit counts a clock based on the first access size and controls the timings in accordance with the count result.

9. The system of claim 1, wherein
the first memory includes a memory cell array and a control circuit which accesses the memory cell array, and
the control circuit receives an address from the memory controller, increments the address based on the first access size, and accesses the memory cell array using the incremented address.

10. The system of claim 1, wherein the first memory includes a buffer which stores write data with the second access size written to the second memory.

11. The system of claim 10, wherein the first memory includes a control circuit which writes the write data with the second access size to the buffer after write data with the first access size is received.

12. The system of claim 11, wherein in a case where sudden power loss occurs before writing to the second memory is completed, the memory controller transfers the write data stored in the buffer to the second memory after the power returns.

13. The system of claim 1, wherein the memory controller includes a first error checking and correcting (ECC) circuit which performs error correction on the first access size and a second ECC circuit which performs error correction on the second access size.

14. The system of claim 13, wherein the second ECC circuit has a higher correction capability than the first ECC circuit.

15. The system of claim 1, wherein the first bus and the second bus are shared as a common bus.

16. The system of claim 1, wherein
the access unit comprises a data body and management information on the data body,
data of the first access size is the management information, and
data of the second access size is the data body.

17. The system of claim 1, wherein
the first memory is a magnetic random access memory (MRAM), and
the second memory is a NAND flash memory.

18. The system of claim 1, wherein
the memory controller receives write data from the external device, the write data including a first data portion and a second data portion, the first data portion having the first access size, and the second data portion having the second access size, and
the memory controller writes the first data portion to the first memory and writes the second data portion to the second memory.

19. The system of claim 1, wherein
read data includes a first data portion and a second data portion, the first data portion having the first access size, and the second data portion having the second access size,
the memory controller reads the first data portion from the first memory and reads the second data portion from the second memory, and
the memory controller sends the read data to the external device.

20. The system of claim 1, wherein
the first memory comprises a nonvolatile memory, and
the second memory comprises a nonvolatile memory.

* * * * *